(12) United States Patent
Nye, III et al.

(10) Patent No.: US 6,261,945 B1
(45) Date of Patent: Jul. 17, 2001

(54) CRACKSTOP AND OXYGEN BARRIER FOR LOW-K DIELECTRIC INTEGRATED CIRCUITS

(75) Inventors: Henry A. Nye, III, Brookfield, CT (US); Vincent J. McGahay, Poughkeepsie, NY (US); Kurt A. Tallman, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/501,649

(22) Filed: Feb. 10, 2000

(51) Int. Cl.$^7$ ................................................ H01L 21/4763
(52) U.S. Cl. .................... 438/633; 257/629; 257/635; 257/637; 438/669
(58) Field of Search ...................... 438/584, 633, 438/669; 257/508, 522, 629, 635, 637

(56) References Cited

U.S. PATENT DOCUMENTS 5,530,280 * 6/1996 White ...................................... 257/508
6,091,131 * 7/2000 Cook et al. ........................... 257/629

* cited by examiner

*Primary Examiner*—David Nelms
*Assistant Examiner*—Reneé R. Berry
(74) *Attorney, Agent, or Firm*—Eric W. Petraske

(57) ABSTRACT

A copper-interconnect, low-K dielectric integrated circuit has reduced corrosion of the interconnect when the crackstop next to the kerf is also used as the primacy barrier to oxygen diffusion through the dielectric, with corresponding elements of the crackstop being constructed simultaneously with the circuit interconnect elements; e.g. horizontal interconnect elements have a corresponding structure in the crackstop and vias between interconnect layers have corresponding structures in the crackstop.

12 Claims, 1 Drawing Sheet

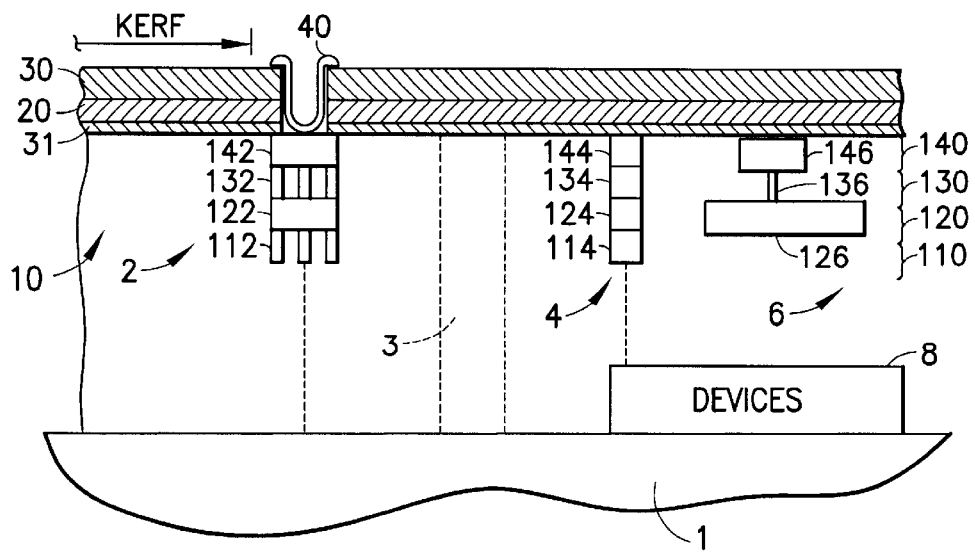
FIG.1
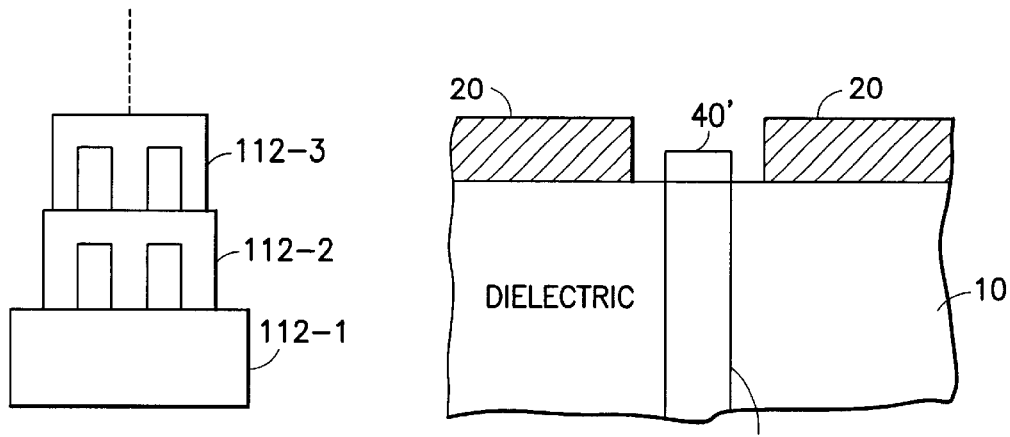
FIG.2
FIG.3
PRIOR ART

CRACKSTOP AND OXYGEN BARRIER FOR LOW-K DIELECTRIC INTEGRATED CIRCUITS

TECHNICAL FIELD

The field of the invention is that of integrated circuit processing, in particular circuits having low-K dielectrics and copper metallization.

BACKGROUND OF THE INVENTION

The relatively new field of copper-interconnect integrated circuits offers well known performance advantages, especially when the copper is combined with low-K or porous dielectric materials, such as amorphous carbon, FLARE and Naroglas, from Allied Signal and SiLK, available from Dow Chemicals. It has been found, however, that such a combination of materials is unexpectedly susceptible to corrosion from oxygen. The methods of blocking oxygen used in the prior art have proved to be ineffective, even though nitride and oxide are good barriers to oxygen, and an improved method of blocking corrosion is now required.

SUMMARY OF THE INVENTION

The invention relates to a structure and method for both blocking crack propagation and also for reducing oxygen diffusion into an integrated circuit and subsequent corrosion of the metallization of the circuit.

A feature of the invention is a composite crackstop structure in which corresponding elements of the crackstop are constructed simultaneously with the circuit interconnect elements; e.g. horizontal interconnect elements in the circuit have a corresponding structure in the crackstop and vias between interconnect layers in the circuit have corresponding structures in the crackstop.

Another feature of the invention is a crackstop structure in which the levels taper down in width, so that an upper level is contained within the limit of the next lower level, allowing for process tolerances.

Another feature of the invention is that the crackstop is constructed from the same material as the circuit interconnect members; i.e. the crackstop is susceptible to corrosion, rather than being corrosion resistant.

Another feature of the invention is the use of a metal structure capping the crackstop and inserted in an aperture within the protective dielectric layer.

Yet another feature of the invention is the use of a redundant oxygen barrier internal to the primary crackstop and placed between it and the guard ring.

BRIEF DESCRIPTION OF THE DRAWINGS

FIG. 1 illustrates, in partially pictorial, partially schematic form, a portion of an integrated circuit constructed according to the invention.

FIG. 2 illustrates a detail of a preferred embodiment.

FIG. 3 illustrates a prior art crackstop.

DESCRIPTION OF THE PREFERRED EMBODIMENTS

Referring to FIG. 1, there is shown a portion of the upper part of an integrated circuit. At the top left corner, an arrow labelled kerf indicates the region 10 that will be the kerf of the wafer. In the center, a composite structure forms the crackstop, primarily designed to block the propagation of cracks from the area in or near the kerf into the body of the circuit. Crackstop 2 is embedded within a set of dielectric layers that are not shown separately, but denoted generally with the numeral 6. Across the top of the Figure, nitride layer 20, oxide layer 30 and nitride cap layer 31 combine to seal the top of the circuit.

A metal layer 40, illustratively Al, Cu, or any material forming a good bond with Cu, fills an aperture in layer 20 and extends over the top of layer 30 in order to ensure sealing against oxygen diffusion. Metal 40 (illustratively Al) has been selected to form a good bond with the material of crackstop element 142 (preferably copper) because the interface between the copper and the bottom of nitride 20 is a weak point for crack propagation. Optionally, the aperture can be smaller than the width of the crackstop, but that is not necessary.

In the prior art, as shown in FIG. 3, an opening was provided in layers 20, 30 and 31 on each side of the crackstop structure 2', in order to suppress crack propagation along the interface between the top layer of dielectric 10 and the nitride cap layer 31. Metal 40' over the crackstop and lying within the opening is optional. This approach provided good protection against cracks, but the prior art was not aware of the significance of oxygen penetration through the low-K dielectric material.

Near the center of the Figure, a composite structure, denoted generally by the numeral 2 and comprising layers 112, 122, 132 and 142 serves both as the crackstop structure and also as the primary oxygen diffusion barrier. To the right of the crackstop, a guard ring 4, which was the primary barrier against mobile ion diffusion in the prior art, is now a secondary oxygen barrier. On the right, a portion of the metal interconnect of the circuit is shown for illustrative purposes. Block 146, referred to as a horizontal interconnect member, is a wire extending perpendicular to the plane of the paper. Via 136 is preferably formed along with wire 146 in a conventional dual-damascene process. Below via 136, block 126 schematically represents a horizontal wire, with via 136 forming an electrical connection between wires 126 and 146. All copper members have a conventional diffusion barrier liner that is not shown in the Figures, for simplicity. Between structures 2 and 4 there is a dotted box labelled 3 that schematically represents an optional secondary structure the same as crackstop structure 2. This option provides redundant protection against oxygen diffusion in the event that structure 2 is compromised.

At the bottom of the Figure, box 8 represents schematically the transistors, diodes and other circuit elements that are combined to form the circuit in question. Substrate 1 is a conventional semiconductor substrate, illustratively silicon.

One of the problems addressed by this invention is corrosion of the copper interconnect members 126, 136, 146, etc. by oxygen. It has been found that oxygen diffuses readily through low-k or porous materials and that inadequate coverage by conventional liner materials for the copper interconnect, such as tungsten, TaN, etc. compromises the wiring barriers against oxygen. These barriers are conventionally used to improve adhesion of the copper and to prevent the copper from diffusing away for the interconnect. Accordingly, one skilled in the art would have expected that the liner would protect the copper from oxygen corrosion.

Oxygen can reach the copper both by diffusing through the liner material and/or by passing through cracks, pinholes or other weak points. If this happens, the copper corrodes and/or rapidly passes out into the ambient dielectric material, causing an open circuit or a short to adjacent wiring.

During construction of the circuit, the devices are formed in substrate 1 in any conventional technique, illustratively CMOS, and the interconnect and crackstop are then formed.

Lower level interconnect, such as polysilicon, may be used if desired for the lowest layer or lower layers of the crackstop if they are available. This has the benefit of removing the need for a high aspect ratio opening so that the lowest level of copper can reach the silicon substrate. A continuous crackstop member within the low-k or porous diesectric is required in order to avoid leaving a path for oxygen diffusion.

Once the fabrication of metal interconnect is begun, circuit interconnect elements, guard ring elements and crackstop elements are preferably all formed simultaneously. For example, if the first metal interconnect level is a dual-damascene structure making contact with transistor source, drain and gates, the same mask is used to open apertures at the location of the guard ring and crackstop. If the first interconnect is polysilicon, then that is preferably the bottom level of the crackstop, but that is not essential. The guard ring and crackstop apertures will extend all around the circumference of the integrated circuit, and have a convenient width in the transverse dimension.

The circuit interconnect is illustratively built up in a series of dual-damascene apertures, in which a set of two-level apertures, having vias on the lower level and wires on the upper level, are formed in a dielectric layer in a conventional process. The liner layer is deposited and the copper is then filled with metal, preferably electroplated, in both the vias (and vertical crackstop elements) and in the horizontal wires.

When the interconnect formation process is complete, the crackstop structure 2, consisting of alternate layers of horizontal crackstop members having a width that is not necessarily that of a wire in the circuit and sets, illustratively three in number, of vertical members preferably having the transverse dimensions of vias. The use of multiple vertical members is not essential, but provides redundancy. In the illustrative embodiment, the width of members 122 and 142 is illustratively 9 $\mu$m and the width of the elements in groups 112 and 132 are illustratively 1.5 $\mu$m. It is not necessary that this alternating vertical structure be used and a circuit designer may, if desired, make all the elements of the crackstop the same width; as is done for the guard ring.

The guard ring is illustratively made of members having the same transverse width, in order to provide improved electrical conductivity. It will be connected to ground or to a positive voltage, depending on which polarity of mobile ions the designer prefers to repel and which polarity he desires to attract to the guard ring. Optionally, the guard ring may have the same tapered width structure.

Referring now to FIG. 2, there is shown a detail of a portion of a crackstop structure. Block 112-1 is copper (optionally, polysilicon, nitride or oxide). Dual-damascene structures 112-2 and 112-3 are each formed with a width less than the structure immediately below. The reason for this is that better liner coverage integrity is maintained and weak points for oxygen diffusion in to the crackstop material are avoided. Thus, in the preferred embodiment, each level is made sufficiently narrower than the preceding one that the inevitable misalignment of layers will not expose such a lower corner. For example, if the 3$\sigma$ tolerance in alignment is 0.1 $\mu$m, then the upper layer will be less than the lower layer by 0.2 $\mu$m.

Those skilled in the art will appreciate that the invention applies to many dielectric materials and to many corrosive materials, not just low-k materials and oxygen and that not all the interlayer dielectric materials need to be the same. Further, there are many ways to form interconnect—separate formation of vias and filling the vias, followed by formation of horizontal interconnect members; etching vias first, followed by etching horizontal and simultaneously filling them; etching the horizontals first, followed by the vias, etc. Further, the use of a dual-damascene technique is for cost reduction and is not essential.

While the invention has been described in terms of a single preferred embodiment, those skilled in the art will recognize that the invention can be practiced in various versions within the spirit and scope of the following claims.

We claim:

1. A method of forming an integrated circuit having a continuous composite crackstop structure surrounding the circuit elements including a set of solid crackstop vertical members and a set of solid crackstop horizontal members, comprising the steps of:

forming a set of active devices in a semiconductor substrate; and connecting said set of active devices to form a circuit, by;
   (a) simultaneously forming a first set of interconnect vias and a first set of solid crackstop vertical members in a first layer of porous dielectric;
   (b) simultaneously forming a first set of interconnect horizontal members and a first set of solid crackstop horizontal members in a second layer of said porous dielectric disposed directly on said first layer of dielectric, said first set of crackstop horizontal members being disposed directly above and in contact with said first set of crackstop vertical members;

repeating said steps (a) and (b) above until said set of interconnect members is complete, whereby said set of crackstop members forms said continuous crackstop structure and a final layer of said porous dielectric encloses a final layer of crackstop members;

depositing a cap layer above said final layer of dielectric;

forming an aperture in said cap layer above said crackstop structure and depositing an adherent metal liner in said aperture.

2. A method according to claim 1, in which said steps a) and b) are combined in a dual-damascene method in which a set of via apertures is formed in a lower layer of dielectric for holding a corresponding set of vias and a set of horizontal interconnect apertures overlapping said set of via apertures is formed in an upper layer of dielectric formed above said lower layer of dielectric, and said sets of apertures are simultaneously lined with a diffusion barrier and then simultaneously filled with a conductive material susceptible to corrosion, thereby forming said continuous solid crackstop structure.

3. A method according to claim 2, in which said conductive material is copper.

4. A method according to claim 1, further including forming a second crackstop structure between said crackstop structure and said circuit elements.

5. A method according to claim 1, further including forming a second crackstop structure between said crackstop structure and said circuit elements.

6. A method according to claim 2, in which said conductive material is susceptible to oxidation passing through said porous dielectric.

7. A method according to claim 6, in which said conductive material is copper.

8. A method of forming an integrated circuit having a continuous composite crackstop structure surrounding the circuit elements including a set of solid crackstop vertical members and a set of solid crackstop horizontal members, said crackstop structure being formed from solid materials without cavities extending around said circuit elements, comprising the steps of:

forming a set of active devices in a semiconductor substrate; and connecting said set of active devices to form a circuit, by;
  (a) simultaneously forming a first set of interconnect vias and a first set of solid crackstop vertical members in a first layer of porous dielectric;
  (b) simultaneously forming a first set of interconnect horizontal members and a first set of solid crackstop horizontal members in a second layer of said porous dielectric disposed directly on said first layer of dielectric, said first set of crackstop horizontal members being disposed directly above and in contact with said first set of crackstop vertical members;

repeating said steps (a) and (b) above until said set of interconnect members is complete, whereby said set of crackstop members forms said continuous crackstop structure and a final layer of said porous dielectric encloses a final layer of crackstop members;

depositing a cap layer above said final layer of dielectric;

forming an aperture in said cap layer above said crackstop structure and depositing an adherent metal liner in said aperture.

9. A method according to claim 1, in which said steps a) and b) are combined in a dual-damascene method in which a set of via apertures is formed in a lower layer of dielectric for holding a corresponding set of vias and a set of horizontal interconnect apertures overlapping said set of via apertures is formed in an upper layer of dielectric formed above said lower layer of dielectric, and said sets of apertures are simultaneously lined with a diffusion barrier and then simultaneously filled with a conductive material susceptible to corrosion, thereby forming said continuous solid crackstop structure.

10. A method according to claim 9, in which said conductive material is copper.

11. A method according to claim 8, further including forming a second crackstop structure between said crackstop structure and said circuit elements.

12. A method according to claim 8, further including forming a second crackstop structure between said crackstop structure and said circuit elements.

* * * * *